United States Patent [19]

Glover et al.

[11] Patent Number: 4,987,371

[45] Date of Patent: Jan. 22, 1991

[54] METHOD FOR IN-VIVO SHIMMING

[75] Inventors: Gary H. Glover; Erika Schneider, all of Waukesha, Wis.

[73] Assignee: General Electric Company, Milwaukee, Wis.

[21] Appl. No.: 441,850

[22] Filed: Nov. 27, 1989

[51] Int. Cl.$^5$ .............................................. G01R 33/20
[52] U.S. Cl. .................................... 324/320; 324/307
[58] Field of Search ............... 324/300, 307, 309, 318, 324/319, 320, 322; 335/216

[56] References Cited

U.S. PATENT DOCUMENTS

| | | | |
|---|---|---|---|
| 4,523,166 | 6/1985 | Gross | 335/216 |
| 4,585,992 | 4/1986 | Maudsley | 324/320 |
| 4,720,679 | 1/1988 | Patrick | 324/320 |
| 4,733,189 | 3/1988 | Punchard | 324/318 |
| 4,749,948 | 6/1988 | Duby | 324/320 |
| 4,761,614 | 8/1988 | Prammer | 324/307 |
| 4,899,109 | 2/1990 | Tropp | 324/319 |
| 4,949,044 | 8/1990 | Statewicz | 324/320 |

Primary Examiner—Michael J. Tokar
Attorney, Agent, or Firm—Quarles & Brady

[57] ABSTRACT

In-vivo shimming is performed by acquiring two NMR images with evolution times differing by $$\tau = n \frac{2\pi}{(\omega_1 - \omega_2)},$$

where $\omega_1$, $\omega_2$, are the Larmor frequencies of the dominant proton species of the imaged object. A pixel by pixel division of the image yields a third image whose phase is proportional to magnetic field inhomogeneity. The phase of the third image set has periodic discontinuities as a result of the periodicity of the arctangent function used to extract the phase from the image. These discontinuities are removed by taking the derivative of the phase and integrating the product of that derivative and a weighting function where the weighting function has zero weight at the points of discontinuity. Off-center quadratic terms in the inhomogeneity are removed prior to fitting the linear shimming gradients.

14 Claims, 3 Drawing Sheets

METHOD FOR IN-VIVO SHIMMING

BACKGROUND OF THE INVENTION

This invention relates to nuclear magnetic resonance (NMR) imaging methods and apparatus and more particularly to a method of shimming the magnets used with such apparatus.

In an NMR imaging sequence, a uniform magnetic field $B_0$ is applied to an imaged object along the z axis of a spatial Cartesian reference frame. The effect of the magnetic field $B_0$ is to align some of the object's nuclear spins along the z axis. In such a field the nuclei resonate at their Larmor frequencies according to the following equation:

$$\omega = \gamma B_0 \qquad (1)$$

where $\omega$ is the Larmor frequency, and $\gamma$ is the gyromagnetic ratio which is constant and a property of the particular nucleus. The protons of water, because of their relative abundance in biological tissue are of interest in NMR imaging. The value of the gyromagnetic ratio $\gamma$ for the protons in water is about 4.26 kHz/Gauss. Therefore in a 1.5 Tesla polarizing magnetic field $B_0$, the resonance or Larmor frequency of protons is approximately 63.9 MHz.

In a two-dimensional imaging sequence, a spatial z axis magnetic field gradient ($G_z$) is applied at the time of a shaped RF pulse such that only the nuclei in a slice through the object in a planar slab orthogonal to the z-axis are excited into resonance. Spatial information is encoded in the resonance of these excited nuclei by applying the slice selective gradient pulse $G_z$, applying a phase encoding gradient ($G_y$) along the y axis and then acquiring a NMR signal in the presence of a magnetic field gradient ($G_x$) in the x direction.

In a typical two dimensional imaging sequence, the magnitude of the phase encoding gradient pulse $G_y$ is incremented monotonically between the acquisitions of each NMR signal to produce a view set of NMR data from which a slice image may be reconstructed. An NMR pulse sequence is described in the article entitled: "Spin Warp NMR Imaging and Applications to Human Whole Body Imaging" by W. A. Edelstein et al., *Physics in Medicine and Biology*, Vol. 25 pp. 751-756 (1980).

Materials other than water, principally lipids, may also be found in biological tissue. The protons of lipids have a slightly different gyromagnetic ratio; the lipid frequency is approximately 220 Hz lower than that of water protons in a 1.5 Tesla polarizing magnetic field $B_0$. The difference between the Larmor frequencies of such different substances, under an identical magnetic polarizing field, is termed "chemical shift".

The polarizing magnetic field $B_0$ may be produced by a number of types of magnets including: permanent magnets, resistive electromagnets and superconducting magnets. The latter, superconducting magnets, are particularly desirable because strong magnetic fields may be maintained without expending large amounts of energy. For the purpose of the following discussion, it will be assumed that the magnetic field $B_0$ is maintained within a cylindrical magnet bore tube whose axis is aligned with the z-axis referred to above.

The accuracy of the image formed by NMR imaging techniques is highly dependant of the uniformity of this polarizing magnetic field $B_0$. Most standard NMR imaging techniques require a field homogeneity better than $\pm 4$ ppm ($\pm$) 250Hz at 1.5 Tesla) over the volume of interest, located within the magnet bore. Some chemical shift selective imaging techniques require much better homogeneity (less than 1 ppm). In-vivo spectroscopy of carbon ($^{13}C$) phosphorous ($^{31}P$), and hydrogen ($^1H$) place more severe requirements on the measurements and correction of the inhomogeneity.

The homogeneity of the polarizing magnetic field $B_0$ may be improved by shim coils, as are known in the art. Such coils may be axis-symmetric with the z or bore axis, or transverse to the z or bore axis. The axis-symmetric coils are generally wound around a coil form coaxial with the magnet bore tube while the transverse coils are generally disposed in a so-called saddle shape on the surface of a coil form. Each such shim coils may be designed to produce a magnetic field corresponding to one spherical harmonic of the magnetic field $B_0$. In combination, the shim coils of different order spherical harmonics may correct a variety of inhomogeneities. Among the lowest order shim coils are those which produce a linear gradient along one axis of the spatial reference frame.

Correction of the inhomogeneity of the polarizing field $B_0$ involves adjustment of the individual shim coil currents so that the combined fields of the shim coils just balance any variation in the polarizing field $B_0$ to eliminate the inhomogeneity. This procedure is often referred to as shimming.

Several methods of measuring the inhomogeneities of the polarizing field $B_0$, and hence deducing the necessary shim currents for each shim coil, have been used previously. In one such method, measurements of $B_0$ are made by means of a magnetometer probe which is sequentially positioned to each measurement point. The inhomogeneities of $B_0$ are deduced from a number of such measurements. Repositioning the magnetometer probe between readings, however, makes this a time consuming method. Therefore, this method is most often employed in the initial stages of magnet setup when only a coarse reduction in field inhomogeneity is necessary and accordingly only a few sampled points need be taken.

In another method of measuring the inhomogeneities of the polarizing field $B_0$, a dummy or "phantom" of uniform composition is placed in the magnet bore and the inhomogeneities are deduced from the NMR signals acquired of the phantom. The Larmor frequency of the nuclei of the phantom will vary depending on the total field strength $B_0$ according to equation 1 above. Hence, the line width of the NMR signal from the phantom will indicate the overall variation in the strength of $B_0$ throughout the volume of the phantom. Shimming may then be accomplished by iterative techniques that minimize this spectral width. Such techniques are, of course, limited by problems of local minima and by the time required to perform the iterations.

Alternatively, U.S. Pat. No. 4,740,753, entitled: "Magnet Shimming Using Information Derived From Chemical Shift Imaging", issued Apr. 26, 1988 and assigned to the same assignee as the present application, describes another shimming technique based on chemical shift. In this method, a phantom containing a uniform material (water) is used to make magnetic field measurements at specific locations ("voxels") within the phantom. These measurements are expanded mathematically to provide a map of the inhomogeneities over a volume within the phantom. A proton spectrum must be obtained at each voxel and the position of the resonance line must be determined. Hence, this method is time consuming both in the collection and analyses of data, and therefore, typically only a limited amount of data is acquired. Further, the method assumes that only one proton species is present and hence requires a phantom of single composition.

These above described methods, which measure $B_0$ inhomogeneities in a magnet bore without a phantom, using a magnetometer, or with a uniform phantom, in the chemical shift imaging technique, cannot compensate for inhomogeneities caused by the object to be imaged. For imaging techniques which require magnetic homogeneity of approximately 0.5 ppm or less, the demagnetizing effects of the imaged object become a significant factor in field homogeneity. Although it has been proposed to construct phantoms that accurately mimic the dimensions of the imaged object, e.g. a human, the wide variation in size and complexity of interior anatomy of human subjects makes this a daunting task. Much preferable would be shimming the magnetic field $B_0$ with the imaged object in place. Such shimming will be termed "in-vivo" shimming as distinguished from shimming on an empty bore or with a phantom. Ultimate accuracy of shimming requires such in-vivo shimming.

SUMMARY OF THE INVENTION

The present invention relates to a method of measuring the inhomogeneities of a polarizing magnetic field $B_0$ while the imaged object, typically a patient, is positioned in the magnet bore. Such In-vivo shimming allows magnetic fields to be corrected to a much higher level of homogeneity. The key to the in-vivo shimming is the adjustment of the phase evolution time of a phase sensitive imaging sequence so that different proton species, principally fat and water of the imaged object, remain in phase despite the chemical shift.

The map of magnetic field inhomogeneity produced by the present invention derives from measurements of phase of the NMR signal at each voxel, and therefore contains discontinuities as a result of the limited range of the arctangent function. These discontinuities are detected by examining the derivative of the inhomogeneity map, where the discontinuities appear as "spikes". A discontinuity weighting function is used to eliminate these spikes.

A low-order function is fit to the map of magnetic field inhomogeneity and used to derive correction gradients to reduce the inhomogeneities. However, it has been determined that when the object is off-center, higher order inhomogeneities degrade the shimming process. Therefore steps are taken to eliminate the effect of such higher order inhomogeneities on the shimming process.

Specifically, according to one embodiment of the invention, a first and second NMR view set is acquired of the imaged object. The phase evolution times $t_{E1}$ and $t_{E2}$ of the pulse sequences used to acquire the first and second NMR view sets, respectively, are selected such that $$t_{E1} - t_{E2} = \frac{2\pi}{(\omega_1 - \omega_2)},$$

where $\omega_1$ and $\omega_2$ are the Larmor frequencies of the dominant proton species of the imaged object. The view sets are reconstructed into a first and second image and a ratio is taken of the corresponding pixels of the resultant first and second images. The phase angle of the divided images will be related to the strength of the magnetic field at the voxels in the imaged object associated with the pixels of the combined image.

It is one object of the invention to provide more accurate shimming of the polarizing magnetic field by permitting in-vivo measurement of magnetic field inhomogeneities. In-vivo measurement of inhomogeneities may be used to correct for both structural inhomogeneities, resulting from the geometry of the magnet, and local field distortions resulting from the imaged object itself. Ordinarily, the phase variations in an NMR image resulting from inhomogeneity of $B_0$ are obscured by phase variations resulting from chemical shift effects produced by the multiple proton species in the imaged object. The selection of the evolution times as described and the subsequent dividing of the two image sets by one another reduces these chemical shift induced phase variations permitting accurate measurement of the phase shifts resulting only from magnetic field inhomogeneities. These latter phase shifts provide an in-vivo map of magnet field $B_0$ inhomogeneity.

It is another object of the invention to reduce the length of time necessary to collect the inhomogeneity data and thus to reduce the total patient scanning time. The NMR view sets required for the above method may be acquired by means of a gradient recalled echo sequence which permits rapid acquisitions of each view set.

The map of magnetic field inhomogeneities, deduced from the phase of the processed NMR image, contains discontinuities every $2\pi$ radians. The partial derivative of this deduced inhomogeneity map is taken along an axis. A discontinuity weighting function is then derived that assigns zero weight to points of discontinuity of the differentiated inhomogeneity map.

It is thus another object of the invention to allow the use of weighted curve fitting techniques to match the shimming gradients to the discontinuous inhomogeneity map initially produced from the processed NMR images. The above described weighting process removes discontinuities from the weighting process.

In a further embodiment, an amplitude weighting function can be constructed from the corresponding magnitude image. This weighting function may be used to modify the curve fitting such that points of low intensity in the magnitude image have decreased importance in the fitting process. A weighted fit using this amplitude weighting function is then performed on the product of the differentiated inhomogeneity map and the discontinuity weighting function to produce a corrected inhomogeneity map. The gradients of the shimming coils are then adjusted to produce this corrected inhomogeneity map.

It is therefore yet another object of the invention to provide an indication of magnetic field that is free from errors resulting from low signal strength as indicated by the amplitude of pixels of the inhomogeneity map.

The magnetic inhomogeneity map may be modeled as a combination of a low order inhomogeneity terms and and higher order inhomogeneity terms. If the higher order terms are not centered in the region of interest they may adversely affect the curve fitting of the lower order shimming gradients to the inhomogeneity map. In a further embodiment of the invention, the location of an off-center higher order inhomogeneities are estimated from the inhomogeneity map. The fit of a low order gradients to the inhomogeneity map is then corrected to remove the influence of the off-center higher order inhomogeneities on the shimming process.

It is thus another object of the invention to improve the overall shimming of an inhomogeneous magnetic field with off-center high order inhomogeneities.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
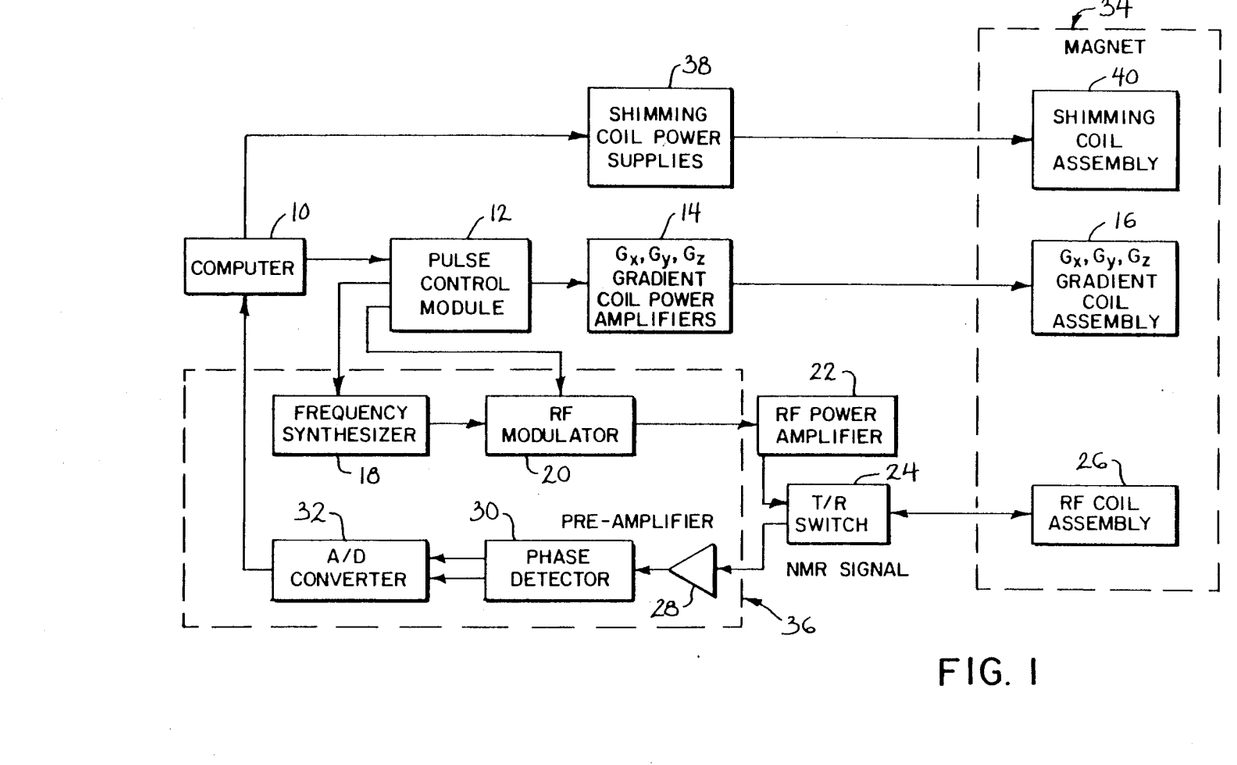
FIG. 1 is a schematic block diagram of an NMR system suitable for the practice of this invention.

FIG. 1 is a block diagram of an NMR imaging system of a type suitable for the practice of the invention. It should be recognized, however, that the claimed invention may be practiced on any suitable apparatus.

A computer 10 controls a pulse control module 12 which in turn controls gradient coil power amplifiers 14. The pulse control module 12 and the gradient amplifiers 14 together produce the proper gradient waveforms $G_x$, $G_y$, and $G_z$, as will be described below, for a gradient echo pulse sequence. The gradient waveforms are connected to gradient coils 16 which are positioned around the bore of the magnet 34 so that gradients $G_x$, $G_y$, and $G_z$ are impressed along their respective axes on the polarizing magnetic field $B_0$ from magnet 34.

The pulse control module 12 also controls a radio frequency synthesizer 18 which is part of an RF transceiver system, portions of which are enclosed by dashed line block 36. The pulse control module 12 also controls a RF modulator 20 which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The NMR signals from the excited nuclei of the imaged object are picked up by the RF coil 26 and presented to preamplifier 28 through transmit/receive switch 24, to be amplified and then processed by a quadrature phase detector 30. The detected signals are digitized by an high speed A/D converter 32 and passed to computer 10 for processing to produce NMR images of the object.

The computer 10 also controls a series of shimming coil power supplies 38 which provide current to shimming coils 40. Each shimming coil may generate magnetic field aligned with $B_0$ with variations in intensity along chosen axes. The first order shimming fields are typically produced by the gradient coils 16, with higher order shimming gradients produced by the shimming coils 40.

The following discussion considers a gradient echo pulse sequence and a spin echo pulse sequence produced on the above described apparatus and suitable for use with the present invention. It should be understood, however, that the invention may be used with other pulse sequences as will be apparent from the following discussion to one skilled in the art.

Figure 2:
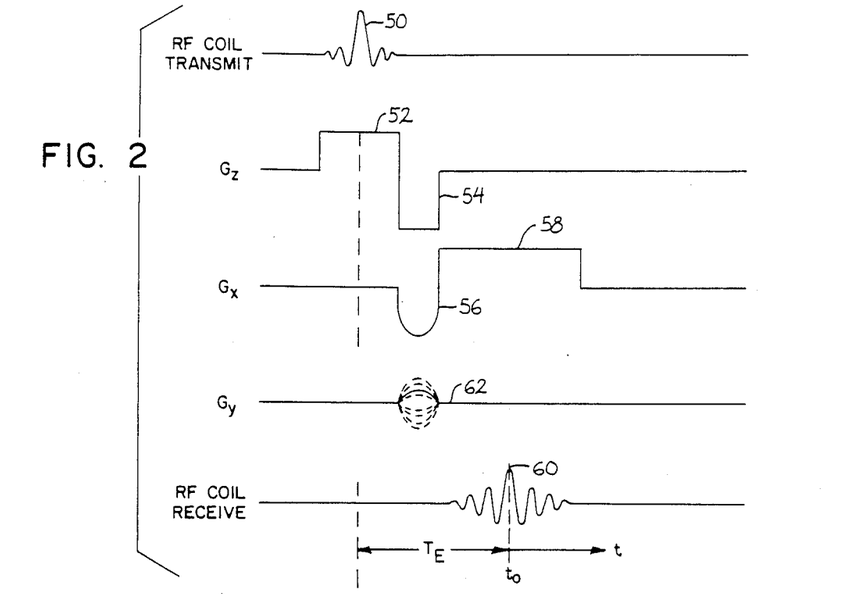
FIG. 2 is a graphic representation of a gradient echo NMR pulse sequence.

Referring to FIG. 2, a gradient echo pulse of a first embodiment sequence begins with the transmission of a narrow bandwidth radio frequency (RF) pulse 50 in the presence of slice selection $G_z$ pulse 52. The energy and the phase of this initial RF pulse may be controlled such that at its termination the magnetic moments of the individual nuclei are located in the x-y plane of a rotating reference frame of the nuclear spin system. A pulse of such energy and duration is termed a 90° RF pulse. The rotating frame differs from the previously described spatial reference frame in that the rotating frame rotates about the z-axis at a frequency $\omega_0$ equal to the Larmor frequency of the dominant proton species without any gradient fields.

The result of the combined RF signal and gradient pulse 52 is that the nuclear spins of a narrow slice in the three dimensional imaged object along spatial z-plane are excited. Only those spins with a Larmor frequency, under the combined field $G_z$ and $B_0$, within the frequency bandwidth of the RF pulse will be excited. Hence the position of the slice may be controlled by the gradient $G_z$ intensity and the RF frequency.

The negative $G_z$ rewinder gradient pulse 54, serves to rephase the nuclear spins in the x-y plane of the rotating frame. Rewinder pulse 54 therefore is approximately equal to half the area of that portion of slice select gradient 52 which occurs during the RF pulse 50.

After or during the application of the $G_z$ rewinder pulse 54, the $G_x$ prewinder pulse 56 is applied. The prewinder pulse 56 begins to dephase the precessing nuclei: those nuclei at higher spatial locations within the slice advance in phase faster as a result of the $G_x$-induced higher Larmor frequency than those nuclei at lower spatial locations. Subsequently, a positive $G_x$ readout pulse 58, causes the dephased spins to rephase into a gradient echo or NMR signal 60 at or near the center of the read-out pulse 58. The gradient echo 60 is the NMR signal for one view.

In a two dimensional imaging sequence, a gradient pulse $G_y$ 62 is applied to phase encode the spins along the y axis during the prewinder gradient 56. The sequence is then repeated with different $G_y$ gradients, as is understood in the art, to acquire an NMR view set from which a tomographic image of the imaged object may be reconstructed according to conventional reconstruction techniques.

Figure 3:
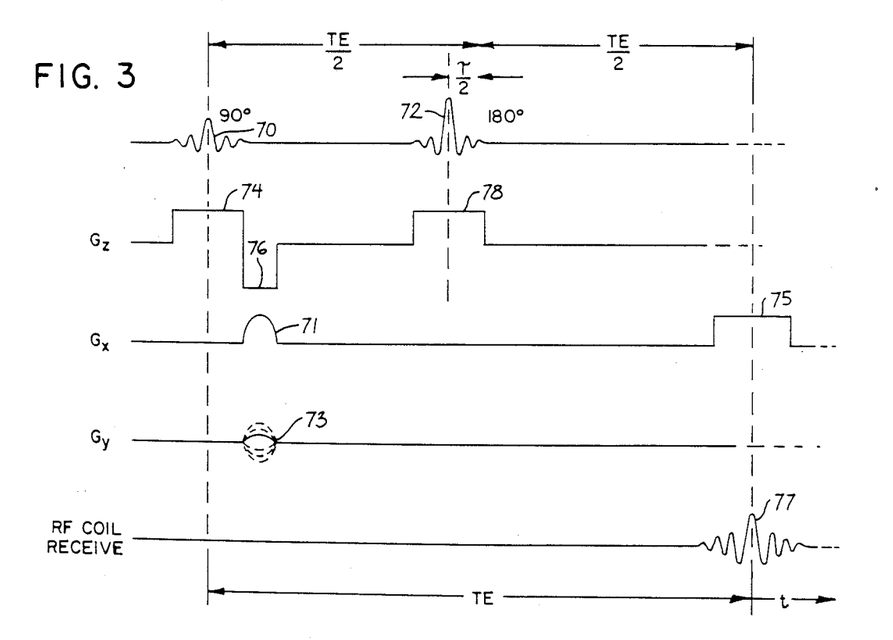
FIG. 3 is a graphic representation of a spin echo NMR pulse sequence.

Referring to FIG. 3, in a second embodiment, a spin echo pulse sequence is used. The spin echo sequence begins with the transmission of a narrow bandwidth 90° radio frequency (RF) pulse 70 in the presence of slice selection $G_z$ pulse 74. As before, the position of the slice may be controlled by the gradient $G_z$ intensity and the RF frequency.

The negative $G_z$ rewinder gradient pulse 76, serves to rephase the nuclear spins in the x-y plane of the rotating frame. Rewinder pulse 74 is equal to half the area of that portion of slice select gradient 74 which occurs after during the RF pulse 70.

During the application of the $G_z$ rewinder pulse 76, a $G_x$ prewinder pulse 71 is applied and a gradient pulse $G_y$ 73 is applied to phase encode the spins along the y axis as described above for the gradient echo pulse sequence.

A second $G_z$ slice selection gradient 78 is centered at a time $(T_E/2) - \tau/2$ after the 90° RF pulse 70 and during this slice selection gradient 78 a narrow bandwidth 180° RF pulse, also centered at a time $(T_E/2) - \xi/2$, is transmitted. This 180° pulse serves to reverse the phase evolution of the spins and to produce a spin echo 77 $T_E$ after the 90° RF pulse 70. The timing of the 180° RF pulse may be adjusted to be $\tau/2$ before the center of the slice selection gradient 78 and hence at time $(T_E-\tau)/2$.

The spin echo 77 occurs during a $G_x$ read-out pulse 75 and forms the NMR signal for one view.

The NMR signal 60 or 77 of either of these embodiments is the sum of the component signals from many precessing nuclei throughout the excited slice. Ideally, the phase of each component signal will be determined by the strength of the $G_z$, $G_x$ and $G_y$ gradients at the location of the individual nuclei during the read out pulse 58, and hence by the the spatial z-axis, x-axis and y-axis locations of the nuclei. In practice, however, numerous other factors affect the phase of the NMR signal 60.

For the purposes of simplifying the following discussion of NMR signal phase, it will be assumed that the object being imaged has no variation in the y direction. The NMR signal 60 may be then represented as follows:

$$S(t) = \int \rho(x) e^{i\gamma G_x x t} \cdot e^{i\gamma B_0(t_E+t)} \cdot e^{i\Omega(x)(t_E+t)} \cdot e^{i\phi} dx \quad (2)$$

where $\rho(x)$ is the spin density, i.e. the number of nuclei at a given voxel in the x direction; $\gamma$ is the gyromagnetic constant of the nuclei of the material being imaged; $B_0$ is the strength of the polarizing magnetic field; $G_x$ is the slope of the x axis gradient and $t_E$ is the phase evolution time to be defined below.

The first complex term of this integral, $e^{i\gamma G_x x t}$, represents the effect of the readout gradient 58 or 75 $G_x$ on the NMR signal S(t). The gradient prewinders 56 or 71, cause this effect to be referenced not from the start of the gradient pulse $G_x$ but from $t_0$ as shown in FIG. 2 and 3.

The second complex term of this equation, $e^{i\gamma B_0(t_E+t)}$, represents the effect of the polarizing field $B_0$ on the NMR signal S(t). $B_0$ is continuously present and hence, in the gradient echo pulse sequence, the effect of $B_0$ on S(t) is measured from the instant of occurrence of the RF pulse 50. The time elapsed since the RF pulse 50, in the gradient echo pulse sequence is $T_E+t$ as shown in FIG. 2.

In the spin echo pulse sequence, however, the 180° RF pulse 72 reverses the phase evolution and therefore the cancels some of the effect of $B_0$ on the phase of S(t). The effective time elapsed since the RF pulse 70, in the spin echo pulse sequence is $\tau$.

Equation (3) addresses both of these pulse sequences: gradient echo and spin echo, through the use of the term $t_E$ defined as the phase evolution time. For a gradient echo pulse sequence as shown in FIG. 2, $t_E$ is equal to $T_E$. For a spin echo pulse sequence as shown in FIG. 3, $t_E$ is equal to $\tau$.

The third complex term of this equation, $e^{i\Omega(x)(t_E+t)}$, arises from inhomogeneities in the magnetic field $B_0$. These inhomogeneities are generally spatially variable and may be derived from the second complex term of equation (2). Specifically $e^{i\gamma B_0(t_E+t)}$ becomes $e^{i\gamma(B_0+\Delta B(x))(t_E+t)}$ where $\Delta B(x)$ is the inhomogeneity of $B_0$ and generally a function of x. This inhomogeneity function may be factored into a separate complex term $e^{i\Omega(x)(t_E+t)}$ where $\Omega(x) = \gamma \Delta B$. The phase error of such inhomogeneities in $B_0$ increases for increasing phase evolution time and hence this term is a function of $t_E+t$, for the same reasons as those described above for the second complex term of equation (2).

The fourth complex term of this equation, $e^{i\phi}$, collects phase lags or leads resulting from the signal processing of the NMR signal chain. For example, the RF coil structure 26, shown in FIG. 1, may introduce certain phase distortions as may the RF power amplifier 22 and the preamplifier 28. These phase terms may also vary with x and are represented by the term $e^{i\phi}$.

This equation (2) may be simplified by recognizing that the NMR signal is typically hetrodyned or shifted in frequency to remove the base frequency of water polarized by the magnetic field $B_0$. This frequency shift transformation is accomplished by multiplying S(t) by $e^{-i\gamma B_0(t_E+t)}$ producing the signal S'(t):

$$S'(t) = \epsilon \rho(x) e^{i\gamma G_x x t} \cdot e^{i\Omega(x)(t_E+t)} \cdot e^{i\phi} dx \quad (3)$$

Equation (3) becomes more complex if the imaged object contains more than one proton species, as in the case of most biological tissue, each proton species having a different resonance offset due to chemical shift. The two dominant proton species in biological tissue are those associated with water and lipid. Let $\rho_1$ be the spin density function of water protons with resonant frequency $\omega_1 = 0$ with respect to $\gamma B_0$, and $\rho_2$ be the spin density function of lipid protons with resonant frequency $\omega_1$, and $\omega_F = \omega_1 - \omega_2$ be the chemical shift or resonant offset of lipid protons with respect to water protons. Equation (3) then becomes:

$$S'(t) = e^{i\phi} \cdot \int [\rho_1(x) e^{i\gamma G_x x t} \cdot e^{i\Omega(x)(t_E+t)} \\ + \rho_2(x) e^{i\gamma G_x x t} \cdot e^{i\omega_F(t_E+t)} \cdot e^{i\Omega(x)(t_E+t)}] \cdot dx \quad (4)$$

representing the signals from both proton species. The new complex term, $e^{i\omega_F(t_E+t)}$, represents a phase offset resulting from the chemical shift which is predominantly a function of $B_0$ and hence proportional to the evolution time $t_E+t$ as has been discussed above.

The following substitutions are now made to simplify the reverse Fourier transformation necessary to produce an image from S'(t):

$$x = x' - \Omega(x)/\gamma G_x \quad (5)$$

$$x = x'' - (\omega_F + \omega(x))/\gamma G_x \quad (6)$$

yielding $$S'(t) = e^{i\phi} \cdot \int \rho_1(x' - \Omega(x)/\gamma G_x) e^{i\gamma G_x \cdot x' t} \cdot e^{i\Omega(x')(t_E)} dx' + \int \rho_2(x'' - (\omega_F + \Omega(x))/\gamma G_x) e^{i\gamma G_x \cdot x'' t} \cdot e^{i\omega_F(T_E)} \cdot e^{i\Omega(x'')(t_E)} dx'' \quad (7)$$

The reconstruction, as mentioned, is performed by performing the reverse Fourier transform upon S'(t) to derive a complex, multipixel image P(x)':

$$P(x)' = \int S'(t) e^{-i\gamma G_x x t} dt \quad (8)$$
$$= e^{i\phi} \cdot (\rho_1(x' - \Omega(x)/\gamma G_x) \cdot e^{i\Omega(x')(tE)} + \rho_2(x'' - (\omega_F + \Omega)/\gamma G_x) \cdot e^{i\omega F(tE)} \cdot e^{i\Omega(x'')(tE)})$$

The pixels of the image P(x)' are displaced from their true positions x by the terms used in the substitution given in equations (5) and (6), however these displacements may be ignored if the displacement is on the order of one pixel. A displacement of less than one pixel will result if the inhomogeneity ΔB of the magnetic field B₀ is small relative to the gradient strength $G_x$. Specifically if $\Omega(x)/\gamma G_x <$ one pixel and $(\omega_F + \Omega(x))/\gamma G_x <$ one pixel or by the previous definition of $\Omega(x)$ in terms of ΔB, ΔB (x)/$G_x$ < one pixel and $\omega_F/\gamma 2G_x + \Delta B(x)/G_x <$ one pixel. For a 1.5 Tesla magnet with a B₀ field of approximately 500,000 times the increment in gradient field per pixel, the pixel displacement will be on the order of one pixel if the magnet is initially within 2 ppm of being homogeneous. The term $\omega_F/\gamma G_x$ is then approximately 1.7 and may be ignored in areas of the imaged object where there there is little change from pixel to pixel. As will be described further below, the curve fitting process will tend to further decrease error resulting from occasional deviations from these assumptions.

Assuming the pixel displacements may be ignored, equation (8) becomes:

$$P(x)' = e^{i\Omega(x)(t_E)} \cdot e^{i\phi}(\rho_1(x) + \rho_2(x) \cdot e^{i\omega F(t_E)}.) \quad (9)$$

The inhomogeneity data $\frac{1}{2}$ may be extracted by performing two experiments and producing two signals P₁(x) and P₂(x) with two different evolution times $t_{E1}$ and $t_{E2}$ such that $$t_{E1} - t_{E2} = n\frac{2\pi}{\omega_F} = \tau$$

for integers n.
For these two experiments:

$$P_1(x) = e^{i\Omega(x)(t_{E1})} \cdot e^{i\phi}(\rho_1(x) + \rho_2(x) \cdot e^{i\omega F(t_{E1})}) \quad (10)$$

and $$P_2(x) = e^{i\Omega(x)(tE1)} \cdot e^{i\phi} \cdot (\rho_1(x) + \rho_2(x) \cdot e^{i\omega F(tE2)}) \quad (11)$$
$$= e^{i\Omega(x)(tE1+\tau)} \cdot e^{i\phi} \cdot (\rho_1(x) + \rho_2(x) \cdot e^{i\omega F(tE1+\tau)})$$
$$= e^{i\Omega(x)(tE1+\tau)} \cdot e^{i\phi} \cdot (\rho_1(x) + \rho_2(x) \cdot e^{i\omega F(tE1)+in2\pi})$$
$$= P_1 e^{i\Omega(x)\tau}$$

A third image P₃ may be produced by dividing image P₂ by P₁, on a pixel by pixel basis, such that $$P_3(x) = \frac{P_2}{P_1} = e^{i\Omega(x)\tau} \quad (12)$$

$$\Delta\phi(x) = \arg(P_3(x)) \quad (13)$$

Thus P₃ is an image whose argument Δφ, (the angle of the complex number $e^{i\Omega(x)\tau}$ is proportional to the inhomogeneity Ω(x). The inhomogeneity Ω(x) may be calculated at any point by dividing Δφ(x), the argument of P₃(x) at the pixel associated with x, by τ.

It will be apparent to those skilled in the art that the above procedure may be expanded to yield a two dimensional image providing phase information over an object slice and that multiple slices could be used to create a three dimensional phase map. The two dimensional image would be obtained by varying gradient $G_y$ as is known in the art per conventional spin warp imaging.

As previously mentioned τ is chosen so that $\tau = 2\pi/\omega_F$. For a 1.5 Tesla magnet and for an imaged object whose dominant proton species are water and fat, τ will be about 4.5 ms. so as to produce the desired phase shift. Clearly any multiple of τ which produces an integer multiple of 2π will also work.

The two signals P₁ and P₂ of equations (10) and 11) above provide a method of eliminating the influence of different proton species on the above described inhomogeneity measurement process and hence permit in-vivo shimming on an imaged object with more than one proton species. It will be apparent from this discussion, however that the above described technique may also be used on a imaged object with only a single proton species, for example on a phantom. In this case, the value of τ is not critical, as there is no need to cancel the effects of two proton species, however two signals P₁ and P₂ are still acquired and the division of equation (12) performed to eliminate the $e^{i\phi}$ term of equation (9).

As has now been described, the argument Δφ(x) of the complex image P₃ divided by τ yields a map of the inhomogeneity Ω(x) over the image P₃'s surface. The complex array P₃ is represented digitally within the NMR system by means of two quadrature arrays indicating the magnitudes of sine and cosine terms of P₃ respectively. The argument or phase angle of P₃ may be extracted by application of the arctangent function to the ratio of these quadrature arrays. The arctangent function has a range of −π to +π and therefore the argument of Δφ(x) will be limited to values within this range. The inhomogeneity Ω is equal to the argument Δφ divided by τ. Hence the deduced inhomogeneity value Ω' will be restricted to the range −π/τ to +π/τ or −πν_F to +90 ν_F where ν_F is the chemical shift frequency $\omega_F/2\pi$.

Figure 4A:
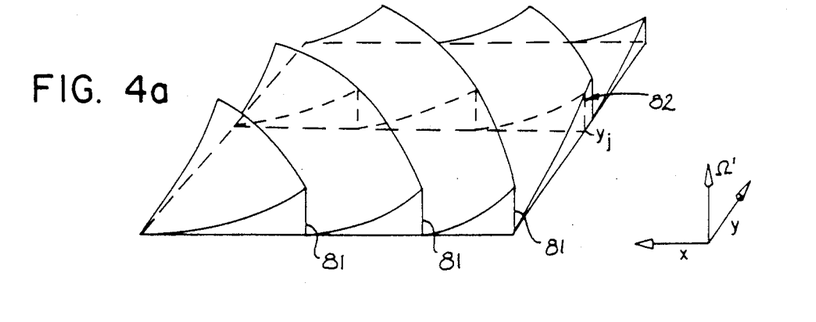
FIG. 4(a) is a three dimensional graph of deduced inhomogeneity $\Omega'$ over an area of an x-y plane.

Referring to FIG. 4(a) an example map of deduced inhomogeneity Ω'(x,y) 80 over a two dimensional image P₃(x,y) is shown with Ω'(x,y) plotted in the vertical dimension. The actual inhomogeneity Ω(x,y) increases monotonically over the surface P₃, however, as explained, the deduced inhomogeneity Ω'(x,y) is bounded between the arctangent imposed limits of πν_F to +πν_F. Accordingly, discontinuities 81 occur at the points where the arctangent function is discontinuous at π and −π. The actual inhomogeneity Ω(x,y) may be determined by by "unwrapping" the discontinuities, a complex topological problem that requires tallying the discontinuities as one moves over the surface of the P₃(x,y) argument array 80 and adding or subtracting 2π to the deduced inhomogeneity Ω' as each discontinuity 81 is passed.

In a further embodiment, this difficult tallying procedure is avoided by taking the spatial partial derivatives of the deduced inhomogeneity map 80.

Figure 4B:
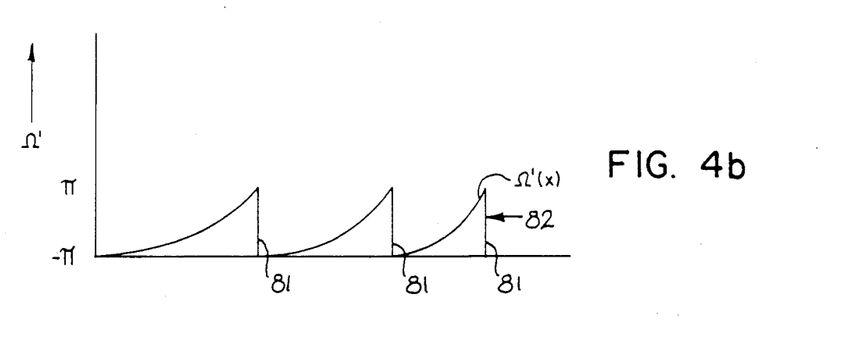
FIG. 4(b) is graph of deduced inhomogeneity $\Omega'$ versus x taken along a line of constant y through the three dimensional graph shown in FIG. 4(a)

Referring to FIG. 4(b), the values 82 of the deduced inhomogeneity map Ω'(x,y) 80, along a line parallel to the x-axis, are shown. Curve 82 rises with increasing Ω', associated with increasing values x, until the Ω' reaches $+\pi\nu_F$ at which point it jumps to $-\pi\nu_F$ as a result of the previously discussed discontinuities at $\pi$ and $-\pi$.

Figure 4C:
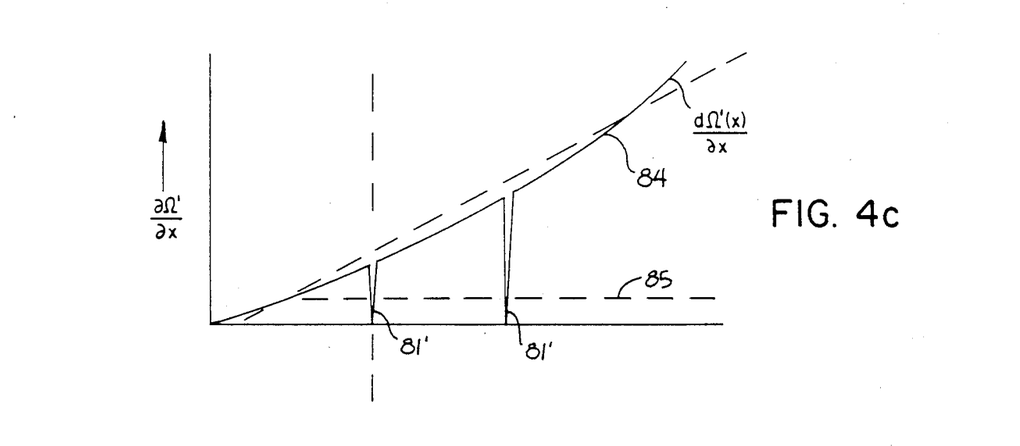
FIG. 4(c) is a graph of the partial derivative of the function graphed in FIG. 4(b), showing a line fitted to the partial derivative without its discontinuities by the least squares method.
Figure 4D:
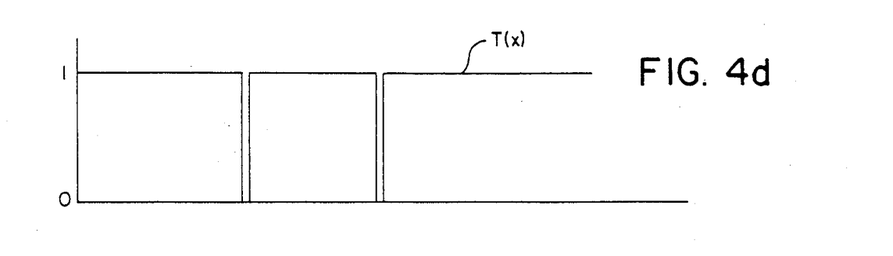
FIG. 4(d) is a graph of the weighting function T(x) used to reduce the discontinuities of the partial derivative of FIG. 4(c) during curve fitting of shimming fields.

A first partial derivative, $\delta\Omega'/\delta x$, along line 82 is shown in FIG. 4(c). The partial derivative exhibits "spikes" 81' at the points of discontinuity 81 in FIG. 3(b). These points of discontinuity may be readily detected by comparing curve 84 to a threshold value 85 and creating a weighting function T(x), as shown in FIG. 4(c), whose value is zero when the magnitude of curve 84 is greater than the threshold value 85 and one otherwise. The threshold is preferably set to $\pi\nu_F/4$ although other values may be used.

A shimming gradient may be fit to this weighted curve 84 according to standard methods, however it is preferable that the gradient curve be fitted instead to:

$$f_x(x) = \int \frac{\delta\Omega'}{\delta x} \cdot T(x,y) dy \qquad (15)$$

which effectively averages the spatial x-axis inhomogeneities together along the y-axis. The curve fitting process may be the least square method or other methods known in the art. Similarly, shim correction gradient values for the shim coils of the y axis may be determined by a similar procedure applied along the y axis.

In another embodiment, an amplitude weighting function W(x,y) is also constructed such that the amplitude weighting function W(x,y) equals zero when the magnitude of image value $P_3$ is less than a second threshold value and one otherwise. The second threshold is set to 15% of the maximum signal magnitude within the area of the image under consideration, although other values could be selected depending on the signal to noise ratio of the image. The amplitude weighting function is used to diminish the importance during curve fitting of portions of curve 84 in which there is little signal strength, as indicated by the magnitude of $P_3$, and hence serves to reduce the effect of noise on the subsequent curve fitting. Therefore, as will be apparent to one of ordinary skill in the art, the weighting function W(x) may be implemented in numerous other ways. For example, W(x) may be a continuous function of the magnitude of the image or the power of the image $(P)^2$. With the amplitude weighting function equation (15) becomes:

$$f_x(x) = \int \frac{\delta\Omega'}{\delta x} \cdot T(x,y) \cdot W(x,y) dy \qquad (16)$$

In instances where the shim coils produce linear gradients and hence may correct only for a linear component of the inhomogeneity $\Omega$, a constant function representing an achievable shim coil gradient is fit to the weighted inhomogeneity map $f_x(x)$. Nevertheless, the inhomogeneity map $\Omega(x)$ often will contain higher order dependencies, for instance, quadratic terms. Quadratic inhomogeneities may be associated with structures within the imaged object and tend to be centered on the center of mass of the imaged object as determined from the reconstructed image.

If a quadratic inhomogeneity is not centered within the region of interest, because the imaged object is not centered within the region of interest, the quadratic inhomogeneities will tend to bias the curve fitting process used to fit the linear shim gradient to the overall inhomogeneity.

If the weighted inhomogeneity map f(x) may be modeled as a second order polynomial:

$$F_x(x) = a_2(x-x_0)^2 + a_1(x-x_0) + c \qquad (17)$$

where $x_0$ is the displacement of the imaged object, hence the displacement of the quadratic inhomogeneities from the center of the region of interest, then:

$$\frac{\delta f_x(x)}{\delta(x)} = 2a_2 x + a_1 - 2a_2 x_0 \qquad (18)$$

The fitting of a linear gradient to the inhomogeneity of expression 17 will involve setting the slope of the linear gradient to the constant term of expression 18, that is: $a_1 - 2a_2 x_0$. The latter part of this constant term, $2a_2 x_0$, however, results not from the linear component of equation 17 but from the quadratic term of equation 17. Note that the quadratic term of equation 17 only contributes to the constant term of equation 18 if the center of mass of the imaged object is not centered on the shim origin, i.e. $x_0 \neq 0$.

It has been determined that the biasing effect of an imaged object with a displaced center of mass is, on the whole, detrimental to the shimming process. Although the biasing effect of the quadratic term improves the shimming for regions near the center of gravity, it vitiates the shim correction over a much broader area.

In a further embodiment, therefore, steps are taken to eliminate the effect of an off-center quadratic term on the shimming process. A first order polynomial $\alpha_2 x + \alpha_1$ is fit to the derivative of the weighted inhomogeneity map $f_x(x)$ of equations 15 or 16 by a standard least squares method or other methods as known in the art. The linear coefficient $\alpha_1$ and the quadratic coefficient $\alpha_2$ of the polynomial will correspond to the components of the differentiated, weighted inhomogeneity function f(x) modeled in equation 18, that is:

$$\alpha_1 = a_1 - 2a_2 x_0, \text{ and} \qquad (19)$$

$$\alpha_2 = 2a_2 \qquad (20)$$

The axis of symmetry of the imaged object, and hence the center, $x_0$, of the quadratic term is next determined by calculating the center of mass of the imaged object from the image P(x,y). Specifically:

$$x_0 = \frac{\int P(x,y) x\, dx\, dy}{\int P(x,y) dx\, dy} \qquad (19)$$

Then, referring to equation 19 and 20:

$$\alpha_1 + \alpha_2 x_0 = a_1 - 2a_2 x_0 + 2a_2 x_0 = a_1 \qquad (20)$$

The x axis shim gradient is adjusted to this term $a_1$ which corresponds to the linear part of the weighted inhomogeneity function f(x) as modeled by equation 17. As will be apparent to one of ordinary skill in the art, this procedure may be applied also to the other shim axes. The same procedure may also be applied to compensate for the effect of higher order off-center inhomogeneities to the extent that that the center of the inhomogeneities may be determined. It is believed that the center of mass of the imaged object may be used to approximate the center of higher order inhomogeneities to the extent required to make the relatively small correction indicated by equation 20.

While this invention has been described with reference to particular embodiments and examples, other modifications and variations, such as application to projection reconstruction imaging techniques, will occur to those skilled in the art in view of the above teachings. For example, although only one dimensional cases have been described for simplicity, the above techniques may be readily applied to two and three dimensional imaging techniques as are known in the art. Also, pulse sequences other than spin echo and gradient echo pulse sequences may be used, as will be understood from this discussion to those of ordinary skill in the art. Accordingly, the present invention is not limited to the preferred embodiment described herein, but is instead defined in the following claims.

We claim:

1. A method of determining the spatial variation of magnetic field strength within an imaged object placed in a polarizing magnetic field, said imaged object including a first and second material with a first and second Larmor frequency, $\omega_1$, $\omega_2$, comprising the steps of:

acquiring a first NMR view set with a first evolution time $t_{E1}$;

acquiring a second NMR view set with a second evolution time $t_{E2}$ such that, for integers n, $$t_{E1} - t_{E2} = n \frac{2\pi}{(\omega_1 - \omega_2)};$$

reconstructing a first and second complex multipixel image from each NMR view set;

dividing each pixel of the first complex multiplexel image by the corresponding pixel of the second multipixel image, on a pixel by pixel basis, to produce a complex multiplexel ratio image; and calculating the argument of each pixel of the complex multipixel ratio image to produce an inhomogeneity map.

2. The method of claim 1 where the NMR view sets are acquired by a gradient echo pulse sequence.

3. The method of claim 1 where the NMR view sets are acquired by a spin echo pulse sequence.

4. The method of claim 1 wherein n=1.

5. A method of calculating shimming gradients from an inhomogeneity map comprising the steps of:

(a) taking the partial derivative of the inhomogeneity map along a shimming axis to produce a differentiated inhomogeneity map;

(b) producing a discontinuity weighting function that assigns zero weight to points of the differentiated inhomogeneity map that have values outside of a predetermined range; and (c) performing a weighted curve fitting to the differentiated inhomogeneity map to determine a correcting shimming field.

6. The method of claim 5 including the step of integrating the differentiated inhomogeneity map along an axis perpendicular to the shimming axis prior to the weighted curve fitting.

7. The method of claim 5 including the additional step of:

generating an amplitude weighting function that assigns weight to points of the differentiated inhomogeneity map in proportion to the magnitude of value of the image at the points; and using both the amplitude weighting function and the discontinuity weighting function in step (d).

8. The method of claim 5 including the additional step of:

generating an amplitude weighting function that assigns weight to points of the differentiated inhomogeneity map in proportion to the power of the image at the points; and using both the amplitude weighting function and the discontinuity weighting function in step (d).

9. The method of claim 5 including the additional step of:

generating an amplitude weighting function that assigns zero weight to points of the differentiated inhomogeneity map that have values with a magnitude less than a predetermined threshold; and using the amplitude weighting function and the discontinuity weighting function in step (d).

10. A method of correcting a magnetic field represented by an inhomogeneity map by means of a shim coil producing a low order compensating shim gradient having a center, the magnetic field having a low order inhomogeneity and an off-center higher order inhomogeneity, comprising the steps of identifying the spatial location of the higher order component along an axis and adjusting the compensating shim gradient to correct the low order inhomogeneity only.

11. The method of claim 10 where the low order inhomogeneity is linear and the higher order inhomogeneity is quadratic.

12. The method of claim 10 where the spatial location of the off-center higher order inhomogeneity is determined by calculating the center of mass of the slice image.

13. A method of correcting a magnetic field having an off-center quadratic component at $x_0$ resulting from an imaged object, by means of a shim coil producing a linear shim gradient, comprising the steps of:

determining a linear coefficient $\alpha_1$ and a quadratic coefficient $\alpha_2$ of the magnetic field along an axis;

determining the center of the quadratic term $x_0$ with respect to the axis; and setting the slope of the shim gradient along the axis equal to $\alpha_1 + \alpha_2 x_0$.

14. The method of claim 13 where the center of the quadratic term is set equal to the center of mass of the image of the imaged object.

* * * * *

UNITED STATES PATENT AND TRADEMARK OFFICE
CERTIFICATE OF CORRECTION

PATENT NO. : 4,987,371

DATED : Jan. 22, 1991

INVENTOR(S) : Glover, Schneider

It is certified that error appears in the above-identified patent and that said Letters Patent is hereby corrected as shown below:

Col. 8, line 32  "(Formula) S'(t)= c" should be --S'(t)=$\int$--.

Col. 9, line 36  "1/3" should be --$\Omega$--.

Col. 10, line 52  minus sign (-) missing in front of formula.

Signed and Sealed this

Twenty-eighth Day of July, 1992

Attest:

DOUGLAS B. COMER

Attesting Officer

Acting Commissioner of Patents and Trademarks